(12) United States Patent
Mizouchi

(10) Patent No.: US 6,738,129 B2
(45) Date of Patent: May 18, 2004

(54) ILLUMINATION APPARATUS, EXPOSURE APPARATUS, AND DEVICE FABRICATING METHOD USING THE SAME

(75) Inventor: Satoru Mizouchi, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/151,985

(22) Filed: May 21, 2002

(65) Prior Publication Data

US 2002/0196419 A1 Dec. 26, 2002

(30) Foreign Application Priority Data

May 22, 2001 (JP) ........................................ 2001-152319

(51) Int. Cl.⁷ ........................... G03B 27/54; G03B 27/42
(52) U.S. Cl. ............................................ 355/67; 355/53
(58) Field of Search ............................. 355/53, 67–71; 356/399–400; 250/548; 359/619

(56) References Cited

U.S. PATENT DOCUMENTS

| 4,682,885 A | 7/1987 | Torigoe ........................ 355/67 |
| 4,939,630 A * | 7/1990 | Kikuchi et al. ............. 362/268 |
| 4,988,188 A * | 1/1991 | Ohta ............................ 355/122 |
| 5,594,526 A * | 1/1997 | Mori et al. .................... 355/67 |
| 5,719,704 A * | 2/1998 | Shiraishi et al. ............ 359/558 |
| 5,963,305 A | 10/1999 | Mizouchi |
| 6,259,512 B1 | 7/2001 | Mizouchi |
| 6,563,567 B1 * | 5/2003 | Komatsuda et al. .......... 355/71 |

FOREIGN PATENT DOCUMENTS

JP  11-54426  2/1999

\* cited by examiner

*Primary Examiner*—Henry Hung Nguyen
(74) *Attorney, Agent, or Firm*—Morgan & Finnegan, L.L.P.

(57) ABSTRACT

An illumination apparatus includes an optical integrator for illuminating a target plane by using light emitted from a light source, the illumination apparatus forming an approximately rectangular illuminated area by using light emitted from the optical integrator that includes a first optical system for enlarging the beam in a longitudinal direction of the illuminated area, and a second optical system for enlarging the beam in a lateral direction of the illuminated area, wherein a light exit plane of the first optical system is provided closer to the target plane than that of the second optical system.

13 Claims, 14 Drawing Sheets

ILLUMINATION APPARATUS, EXPOSURE APPARATUS, AND DEVICE FABRICATING METHOD USING THE SAME

BACKGROUND OF THE INVENTION

The present invention relates generally to illumination optical systems, and more particularly to an illumination apparatus in an illumination apparatus and an exposure apparatus used to expose objects such as single crystal plates for semiconductor wafers, glass plates for liquid crystal displays (LCD), and the like. The present invention is suitably applicable, for example, to an illumination apparatus used for an exposure apparatus that exposes single crystal plates for semiconductor wafers in a step-and-scan projection manner in a photolithography process.

Along with the recent demands on smaller and lower profile electronic devices, minute semiconductor devices to be mounted onto these electronic devices have been increasingly required. For example, a design rule for a mask pattern requires that an image with a size of a line and space (L&S) of 0.1 μm or less be extensively formed and, presumably, it will further move to a formation of circuit patterns of 80 nm or less in the future. L&S denotes an image projected to a wafer in exposure with equal line and space widths, and serves as an index of exposure resolution.

A projection exposure apparatus, which is a typical exposure apparatus for fabricating semiconductor devices, generally includes an illumination optical system that illuminates a mask, and a projection optical system that is located between the mask and an object to be exposed. In order to obtain a uniformly illuminated area, the illumination optical system introduces a beam from a light source to an optical integrator in order to use multiple light sources created at and around the optical integrator's plane of exit as a secondary light source to illuminate a mask plane via a condenser lens.

The resolution R of the projection exposure apparatus is given using a wavelength of the light source (λ) and the numerical aperture (NA) of the projection optical system in the following Rayleigh's equation:

$$R=k_1(\lambda/NA) \tag{1}$$

where $k_1$ is a constant determined by a development process and others, and approximately 0.5~0.7 in a normal exposure.

As mentioned above, the recent demands for highly integrated devices have increasingly required fine patterns to be transferred, i.e., high resolution. It is conceivable from the above equation that a higher numerical aperture NA and reduced wavelength λ would be effective for higher resolution. In recent years, a wavelength of an exposure light source is shifting from KrF excimer laser (with a wavelength of 248 nm) to ArF excimer laser (with a wavelength of 193 nm), and NA is from about 0.6 to about 0.75. Further, a practical application of $F_2$ excimer laser (with a wavelength of 157 nm) is being promoted as an exposure light source.

In the meantime, a design of a lens becomes difficult as a numerical aperture increases, while aberration relates to the numerical apertures. For example, a spherical aberration is proportional to the 3rd order of an NA according to the 3rd order aberration theory. Thus, as the NA increases, the design of a lens becomes difficult. In addition to the numerical aperture, an angle of view (an area that may be projected by a projection lens) also relates to the aberration. For example, a distortion is proportional to the 3rd order of an angle of view according to the 3rd order aberration theory. Therefore, as the angle of view increases, the design of a lens also becomes difficult.

It is the recent trend in the lithography process in the semiconductor fabrication to use a scanning projection exposure apparatus of a step-and-scan type for exposure. A scanning projection exposure apparatus has an advantage in that it may provide not only provide the high resolution and the wide field size, but also the smaller angle of view than a cell projection exposure apparatus and thus the reduced aberrations. Such a scanning projection exposure apparatus requires a uniform illuminance distribution to scan and expose a wafer plane for a pattern of high resolution, and thus an illumination apparatus for illuminating a mask plane is required to form a uniformly illuminated area.

However, it has not yet been verified whether a conventional illumination apparatus illuminates an object plane, such as a mask plane, uniformly and effectively (or with a desired illuminance). In general, an illumination apparatus in a scanning projection exposure apparatus forms a rectangular illuminated area and use it to illuminate the target plane, but the conventional illumination apparatus has had lower illuminance on the periphery in a longitudinal direction of the illuminated area than that in its center, thus causing non-uniform illumination. The non-uniform illumination causes an insufficient pattern transfer to a resist, and cannot provide high quality semiconductor wafers, LCDs, thin-film magnetic heads, and the like. The uniform accumulated illuminance would be available at the illuminated plane using a blade for defining the illuminated area (e.g., a slit with a variable aperture shape, which is sometimes referred to as a field stop) at the illuminated plane (or a plane conjugate with the mask plane) to narrower the width of the slit around the center in the longitudinal direction of the illuminated area than that of its periphery. The more reduced the illuminance on the periphery in the longitudinal direction is, the smaller the slit's center width should be: This would increase the light blocking part, greatly lowering the light utilization efficiency of light used to illuminate the target plane, and thus the throughput.

BRIEF SUMMARY OF THE INVENTION

Accordingly, it is an exemplary object of the present invention to provide an illumination apparatus with high light utilization efficiency, which gives uniform illumination in the longitudinal direction of the illuminated area formed by the illumination apparatus, as well as an exposure apparatus using the same.

An illumination apparatus of one aspect of the present invention includes an optical integrator for illuminating a target plane by using light emitted from a light source, the illumination apparatus forming an approximately rectangular illuminated area using light emitted from the optical integrator that includes a first optical system for enlarging the light in a longitudinal direction of the illuminated area, and a second optical system for enlarging the light in a lateral direction of the illuminated area, wherein a light exit plane (surface) of the first optical system is provided closer to the target plane than that of the second optical system. Such an illumination apparatus arranges the light exit plane of the first optical system for enlarging the beams in the longitudinal direction of the illuminated area is located closest to the target plane. Therefore, the first optical system may have a back focus shorter than the conventional one, reducing distortion in the longitudinal direction. As a result, the illuminated area that this illumination apparatus forms has uniform illuminance, thus improving light utilization efficiency. Here, the first optical system's light incidence plane (surface) and the second optical system's light incidence plane (surface) may be located to be approximately conjugate with the target plane. This illumination apparatus may have rectangular or arc illuminated area on the target plane.

In this illumination apparatus, the first optical system may include a pair of cylindrical lens arrays whose generating line is parallel to the lateral direction, whereas the second optical system may include a pair of cylindrical lens arrays whose generating line is parallel to the longitudinal direction, and wherein a light beam incident upon the optical integrator enters in order from a third lens set, a first lens set, a fourth lens set, and a second lens set where the first and second lens sets are the pair of cylindrical lens arrays in the first optical system in order from a light incidence plane, and the third and fourth lens sets are the pair of cylindrical lens arrays in the second optical system are in order from the light incidence plane.

Here, a light incidence plane of the first optical system and a light incidence plane of the second optical system may be located to be approximately conjugate with the target plane. The first optical system may include in the longitudinal direction an optical element that extends in the lateral direction, whereas the second optical system may include in the lateral direction an optical element that extends in the longitudinal direction, and wherein the first optical system may be located closer to the target plane than the second optical system. Such an optical element is a convex lens array or a concave mirror array (or a cylindrical lens array or a cylindrical mirror array). The first optical system's light incidence plane of incidence and the second optical system's light incidence plane may be located approximately conjugate with the target plane.

Further, an exposure apparatus as another aspect of the present invention includes any one of the above-mentioned illumination apparatuses and an optical system that projects a pattern formed on a reticle or mask onto an object to be exposed. Such an exposure apparatus includes the above illumination apparatus, and exhibits the same operations, as well as realizing projection and exposure with high light utilization efficiency and satisfactory throughput.

A device fabricating method as still another aspect of the present invention includes the steps of exposing the object by using the above exposure apparatus, and performing a specified process for the exposed object. Claims for the device fabricating method that exhibits operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
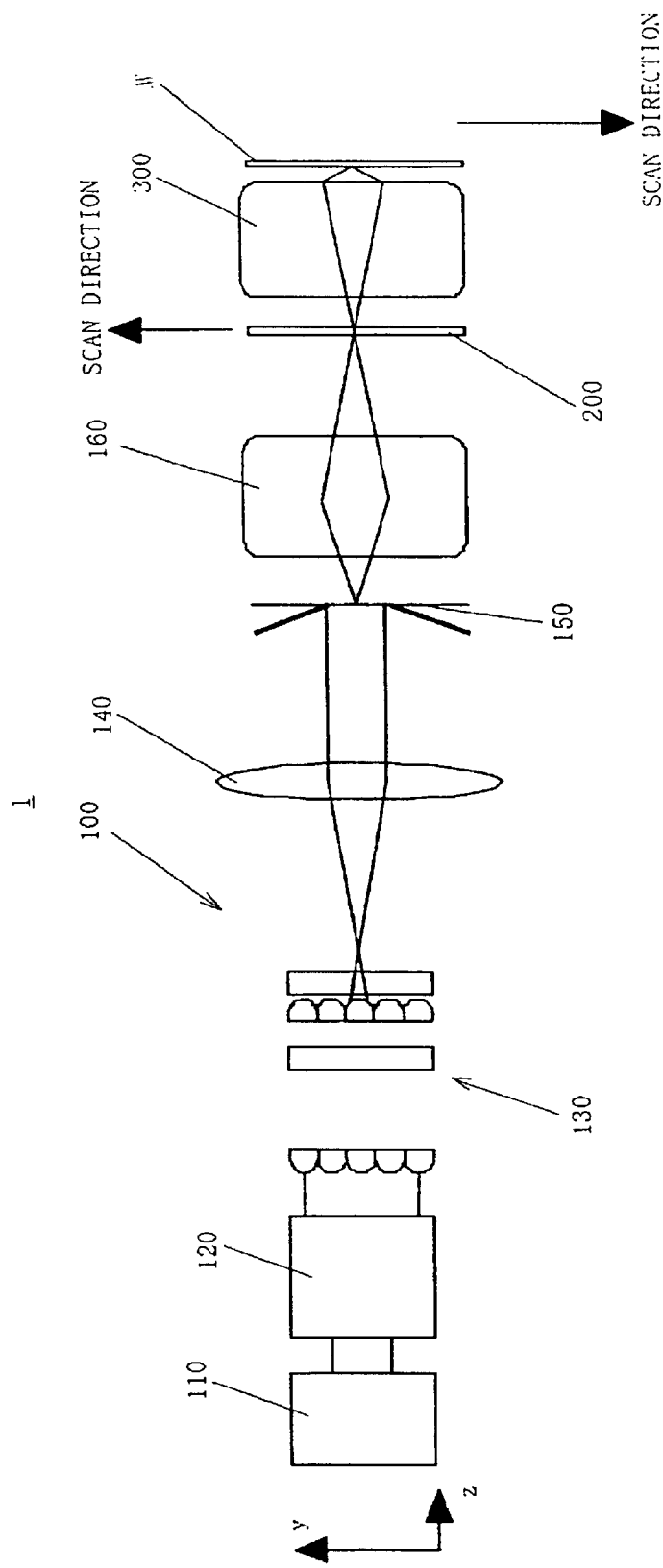
FIG. 1 is a schematic side view of an exemplary exposure apparatus of the present invention and an illumination apparatus as its part.
Figure 2:
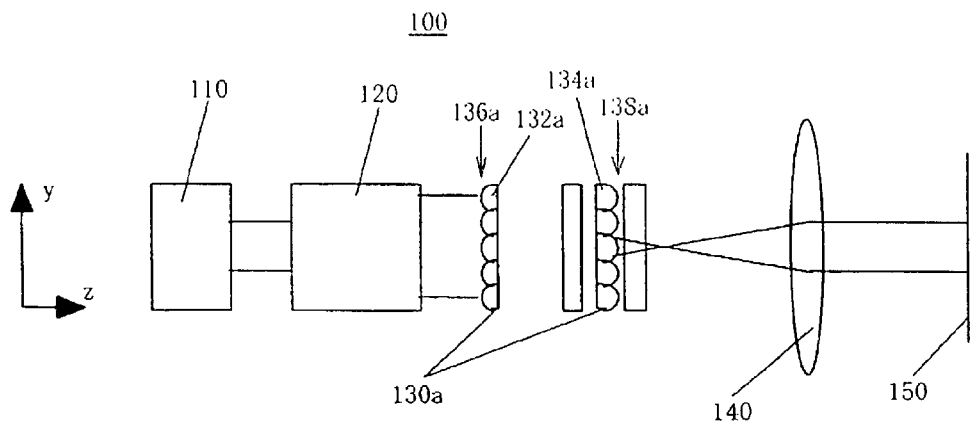
FIG. 2 is a schematic side view showing part of the illumination apparatus shown in FIG. 1.
Figure 3:
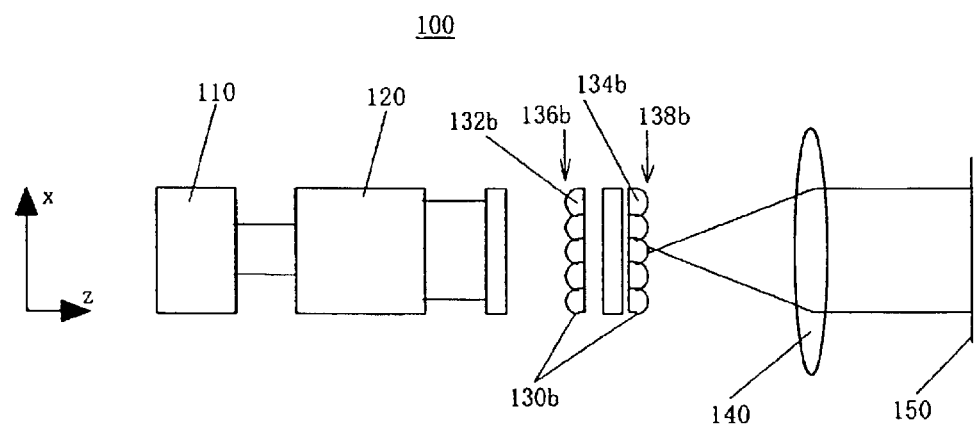
FIG. 3 is a schematic side view showing part of the illumination apparatus shown in FIG. 1 viewed from a direction different from that in FIG. 2.

A description will now be given of an exemplary exposure apparatus 1 and illumination apparatus 100 of the present invention with reference to accompanying drawings. The same reference numeral in each figure denotes the same element. Here, FIG. 1 is a schematic side view of the exposure apparatus 1 of the present invention and the illumination apparatus 100 as its part. FIG. 2 is a schematic side view showing part of the illumination apparatus 100 shown in FIG. 1. FIG. 3 is a schematic side view showing the part of the illumination apparatus 100 shown in FIG. 1 viewed from a direction different from that in FIG. 2 (i.e., rotated by 90° around an optical axis). It is understood that FIGS. 2 and 3 somewhat simply draw a masking blade 150. FIGS. 1–3 determine a direction of the optical axis as an axis z, and two orthogonal directions on a plane perpendicular to the optical axis (i.e., lateral and longitudinal directions of a rectangular illuminated area) as axes y and x. As shown in FIG. 1, the exposure apparatus 1 includes the illumination apparatus 100, a mask 200, and a projection optical system 300.

The exposure apparatus 1 of the instant embodiment is a projection exposure apparatus that projects a circuit pattern formed on the mask 200 onto an object to be exposed W in a step-and-scan manner, but the present invention can be applied to a step-and-repeat manner and other exposure manners. The step-and-scan manner, as used herein, is one exposure method for exposing a mask pattern onto the object W by continuously scanning the object relative to the mask, and by moving, after one shot of exposure, the object stepwise to the next shot of exposure area. The step-and-repeat manner is another exposure method that moves the object stepwise to an exposure area for the next shot every shot of cell projection onto the object.

Typically, the illumination apparatus 100 includes a light source part and illumination optical system, thus illuminating the mask 200 that forms a pattern to be transferred.

The light source part includes a laser 110 and beam shaping system 120, as a light source for illuminating the illumination optical system.

The laser 110 may use a beam from pulse laser such as an ArF excimer laser with a wavelength of about 193 nm, a KrF excimer laser with a wavelength of about 248 nm, an $F_2$ excimer laser of a wavelength of about 157 nm, etc. A kind of the laser 110 is not limited to the excimer laser. For example, a YAG laser may be used, and the number of laser units is not limited. Moreover, the light source may be, for example, an ultra-high pressure mercury lamp (g-line with a wavelength of about 436 nm or i-line with a wavelength of about 365 nm), or a xenon lamp generally having an output of 500 W or higher.

The beam shaping system 120 may use, for example, a beam expander having a plurality of cylindrical lenses etc. and converts an aspect ratio of a size of a sectional shape of parallel light from the laser 110 into a desired value (for example, by changing the sectional shape from a rectangle to a square), thus shaping the beam shape to a desired one. The beam shaping system 120 forms a beam that has a size and an angle of divergence needed to illuminate the optical integrator 130 described later.

Preferably, the light source part uses an incoherently turning optical system, though it is not shown in FIG. 1, which turns a coherent laser beam into an incoherent one. The incoherently turning optical system may use an optical system that includes at least one return system, for example, as disclosed in FIG. 1 in Japanese Laid-Open Patent Application No. 3-215930, which splits an incident beam on a beam splitting plane into at least two beams (e.g., p polarized light and s polarized light). The return system then provides one of them, relative to the other, with an optical path length difference more than the coherence length of a laser beam via an optical member, and subsequently leads it to the light splitting plane so that the superimposed light is emitted.

The illumination optical system is an optical system that illuminates the mask 200, and includes an optical integrator (or light integrator) 130, a condenser lens 140, a masking blade 150, and an image-forming lens 160. The illumination optical system can use a condensing optical system between the light source and the optical integrator 130, although not shown in FIGS. 1–3. The condensing optical system includes a necessary deflecting mirror(s) and lens(es), and efficiently introduces a beam that has passed through them into the optical integrator 130. For example, the condensing optical system includes a condenser lens that is arranged such that light exit surface (plane) of the beam shaping system 120 and a light incidence surface (plane) of the optical integrator 130 (namely, the respective light incidence planes of the optical systems 130a and 130b) are in an optical relationship between an object plane and a pupil plane (or a pupil plane and an image plane) (which relationship is sometimes called a Fourier transformation relationship in this application), whereby a principal ray of a light beam that has passed the lens may be maintained to be parallel to any of lens elements 132a, 134a, 132b, and 134b in and around the center in the optical integrator 130.

The optical integrator 130 serves to uniformize illumination light for illuminating the mask 200, and splits a light beam emitted from the beam shaping system 120 into many partial beams in this embodiment, thus forming an effective light source. The optical integrator 130 provides approximately rectangular illumination to an object plane, i.e., the masking blade 150. This embodiment makes the optical integrator 130 of optical systems 130a and 130b, and their light incidence plane 136a and 136b are adapted to be in a relationship approximately conjugate with the target plane.

As shown in FIGS. 2 and 3, the optical system 130a, arranges in a row in a direction y a pair of cylindrical lens arrays 132a and 134a each extending in a direction x to enlarge an angular distribution of light of incidence in the direction y (in a lateral direction of the rectangular illuminated area). This specification sometimes states that this arrangement has a power component primarily in a plane yz. A pair of cylindrical lens arrays 132a and 134a in the optical system 130a have power to enlarge the angular distribution smaller than that of the optical system 130b, which will be described later.

As shown in FIGS. 2 and 3, the optical system 130b, arranges in a row in the direction x a pair of cylindrical lens arrays 132b and 134b each extending in the direction y to enlarge the angular distribution of light of incidence in the direction x (in a longitudinal direction of the rectangular illuminated area). This specification sometimes states that this arrangement has a power component primarily in a plane xz. A pair of cylindrical lens arrays 132b and 134b in the optical system 130b have power to enlarge the angular distribution larger than that of the optical system 132, which will be described later. As the instant embodiment exemplarily assigns the direction y to the scan direction, the optical system 130b is adapted to have a larger power component than the optical system 130a.

The optical integrator 130 having these optical systems 130a and 130b in this embodiment is characterized in that the light exit plane of the optical system for enlarging the angular distribution of light of incidence in the longitudinal direction of the illuminated area, i.e., a light exit plane 138b of the optical system 130b in this embodiment is located closer to the illuminated plane than the optical system for enlarging the angular distribution of light of incidence in the lateral direction of the illuminated area, i.e., the optical system 130a in the instant embodiment. Preferably, light condensing positions at sides of the light exit planes 138a and 138b of the optical systems 130a and 130b with respect to the sections yz and xz are designed to be in a back space to prevent their optical elements from getting damaged by their enormous energy density.

From the above conditions, the optical systems 130a and 130b are characteristically arranged in order from the light source of the cylindrical lens arrays 132a, 132b, 134a and 134b to avoid distant light condensing positions with respect to the sections yz and xz at the sides of the planes of exit 138a and 138b and only one extended back focus (or condensing point).

Figure 11:
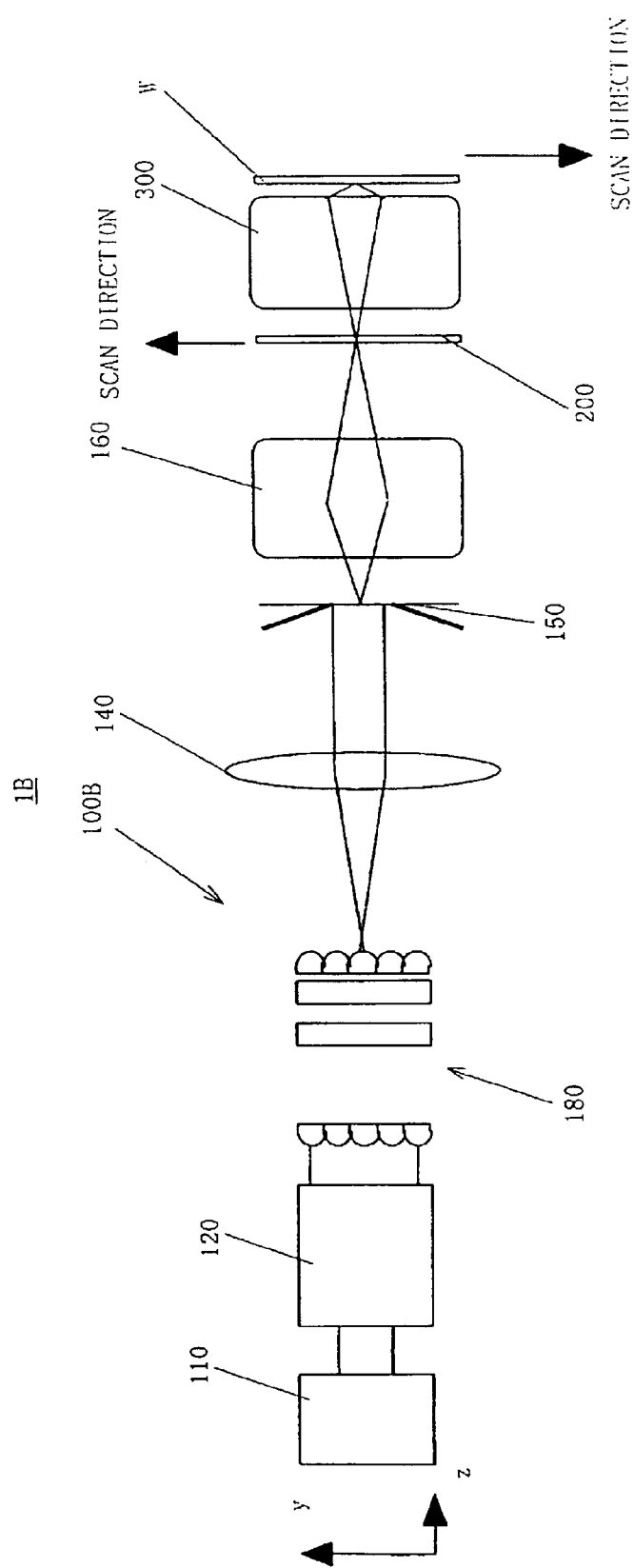
FIG. 11 is a schematic side view showing a conventional exposure apparatus and an illumination apparatus as its part.
Figure 12:
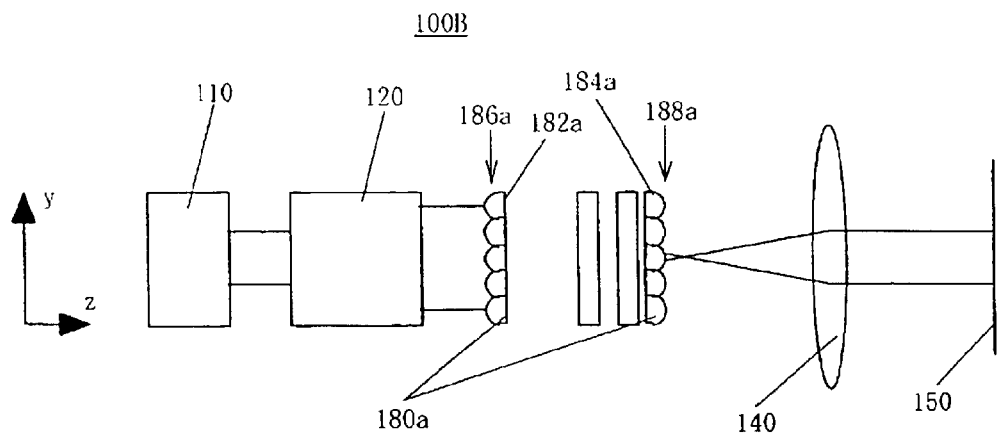
FIG. 12 is a schematic side view showing part of the exposure apparatus shown in FIG. 11.
Figure 13:
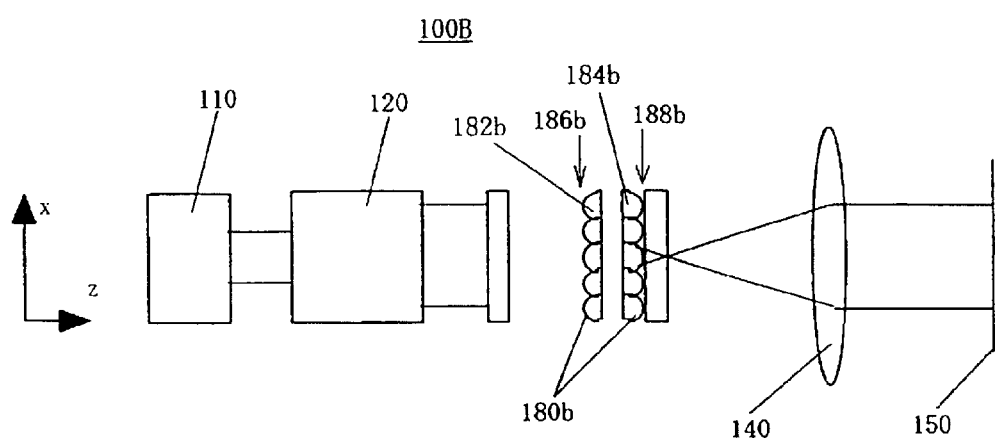
FIG. 13 is a schematic side view showing the part of the exposure apparatus shown in FIG. 11 viewed from a direction different from that in FIG. 12.

In order to articulate the optical integrator in the inventive illumination apparatus 100, a description will be given of an optical integrator 180 in a conventional illumination apparatus 100B. Here, FIG. 11 is a schematic side view showing an exposure apparatus 1B and illumination apparatus 100B as part of it. FIG. 12 is a schematic side view showing part of the illumination apparatus 100B shown in FIG. 11. FIG. 13 is a schematic side view showing the part of the illumination apparatus shown in FIG. 11 viewed from a direction different from that in FIG. 12 (i.e., rotated by 90° around the optical axis). It is understood that FIGS. 12 and 13 somewhat simply draw a masking blade 150. The same element as that in the exposure apparatus 1 and the illumination apparatus 100 is designated by the same reference numeral, and a duplicate description thereof will be omitted.

The optical integrator 180 serves to uniformize illumination light for illuminating the mask 200, and splits a light beam emitted from the beam shaping system 120 into many partial beams, thus forming an effective light source. The optical integrator 180 provides an approximately rectangular illumination to an object plane, i.e., the masking blade 150. The optical integrator 180 includes optical systems 180a and 180b, and their planes of incidence 186a and 186b are disposed in a relationship appropriately conjugate with the object plane.

As shown in FIGS. 12 and 13, the optical system 180b arranges in a row in the direction x a pair of cylindrical lens arrays 182b and 184b which extend in the direction y, and have a power component primarily in the plane xz. The pair of the cylindrical lens arrays 182b and 184b in the optical system 180b have a power component larger than that of the optical system 180a, which are described above.

As shown in FIGS. 12 and 13, the optical system 130b arranges in a row in the direction x a pair of cylindrical lens arrays 182b and 184b which extend in the direction y, and have a power component primarily in the plane xz. The pair of the cylindrical lens arrays 182b and 184b in the optical system 130b have a power component larger than that of the optical system 132, which will be described later.

The conventional optical integrator 180 having these optical systems 180a and 180b arranges the optical system for enlarging the angular distribution of light of incidence in the lateral direction of the illuminated area, i.e., a light exit plane 188a of the optical system 180a, closer to the illuminated plane than a light exit plane of the optical system for enlarging the angular distribution of light of incidence in the longitudinal direction of the illuminated area, i.e., a light exit plane 188b of the optical system 180b. Light condensing positions at sides of the light exit planes of exit 188a and 188b of the optical systems 180a and 180b with respect to the sections yz and xz are designed to be in a back space to prevent their optical elements from getting damaged by their enormous energy density.

From the above conditions, the conventional optical integrator 180 characteristically arranges the optical systems 180a and 180b in order from the light source of the cylindrical lens arrays 182a, 182b, 184a and 184b to avoid distant light condensing positions with respect to the sections yz and xz at the sides of the planes of exit 188a and 188b and only one extended back focus (or condensing point).

Figure 14:
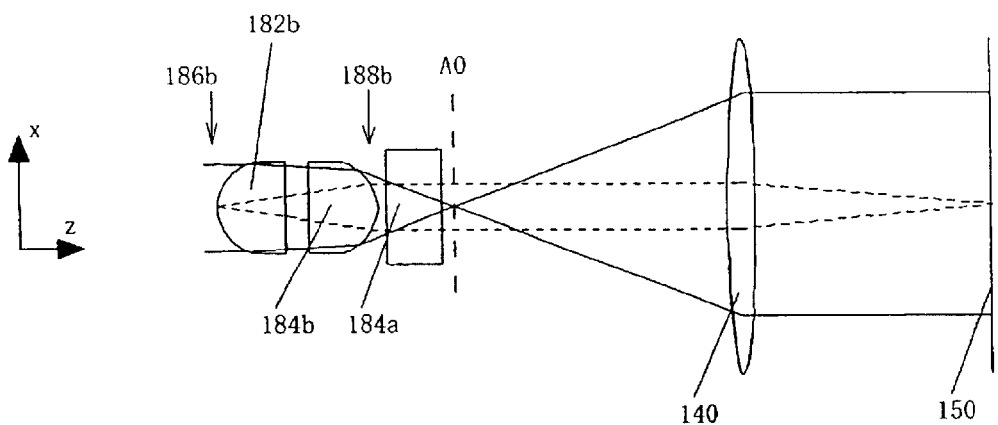
FIG. 14 is a schematic side view showing in detail part of the illumination optical system shown in FIG. 13.
Figure 15:
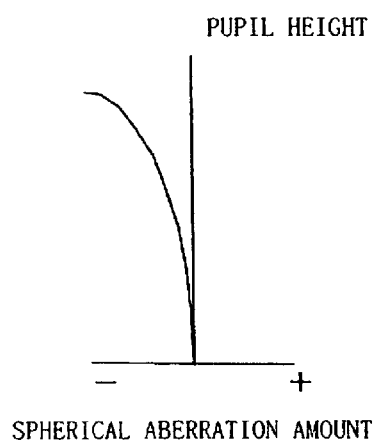
FIG. 15 is a graph showing spherical aberration at a plane A0 shown in FIG. 14.

Here, it is assumed that parallel light enters the conventional optical integrator 180 having such a structure. Parallel light shown by solid lines in FIG. 14 enters the optical system 180b, i.e., a plane of incidence 186b of the cylindrical lens array 182b. Here, FIG. 14 is a schematic side view showing in detail part of the illumination optical system 500 shown in FIG. 13. As stated above, as the cylindrical lens arrays 184a of the optical system 180a exists behind the optical system 180b, light formed by the optical system 180b has a back focus (or condensing point) designed to be located behind the cylindrical lens array 184a, i.e., at a plane A0 in the drawing. However, the extended back focus (or condensing point) causes large spherical aberration (although it is actually only for light with respect to the section xz, it is referred to as spherical aberration) as shown in FIG. 15. FIG. 15 is a graph showing the spherical aberration at the plane A0 shown in FIG. 14.

Figure 16:
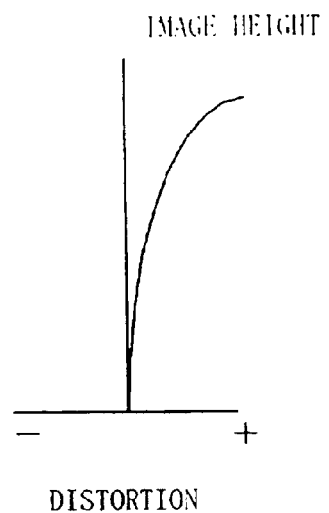
FIG. 16 is a graph presenting as distortion the spherical aberration shown in FIG. 15.
Figure 17:
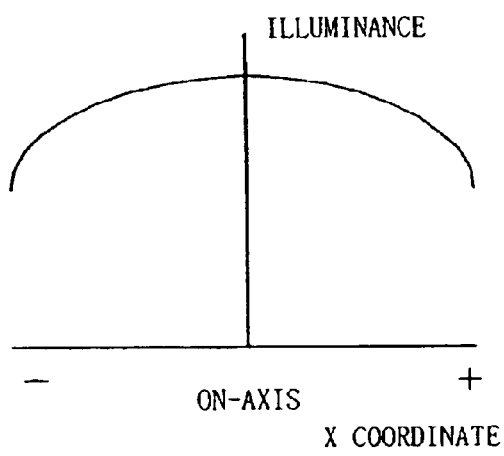
FIG. 17 is a graph showing an illumination distribution of an illuminated plane shown in FIG. 14.

The light incidence plane 186b of the cylindrical lens array 182b and the target plane (i.e., the masking blade 150) are approximately conjugate with each other. When the light incidence plane 186b and the target plane are evaluated as object and image planes, respectively, the above spherical aberration may be expressed as distortion in FIG. 16. Here, FIG. 16 is a graph that represents the spherical aberration shown in FIG. 15 as distortion. It is understood from FIG. 16 that as an image height becomes tall, an image shifts upwardly from the ideal image height. Where uniform light enters the light incidence plane 186b, the light incidence plane 186b extends a light beam longer as the light beam is separated from the axis. Accordingly, an illumination distribution at the illuminated plane greatly hangs down with distance from the axis as shown in FIG. 17. FIG. 17 is a graph that shows the illumination distribution on the illuminated plane shown in FIG. 14.

Figure 18:
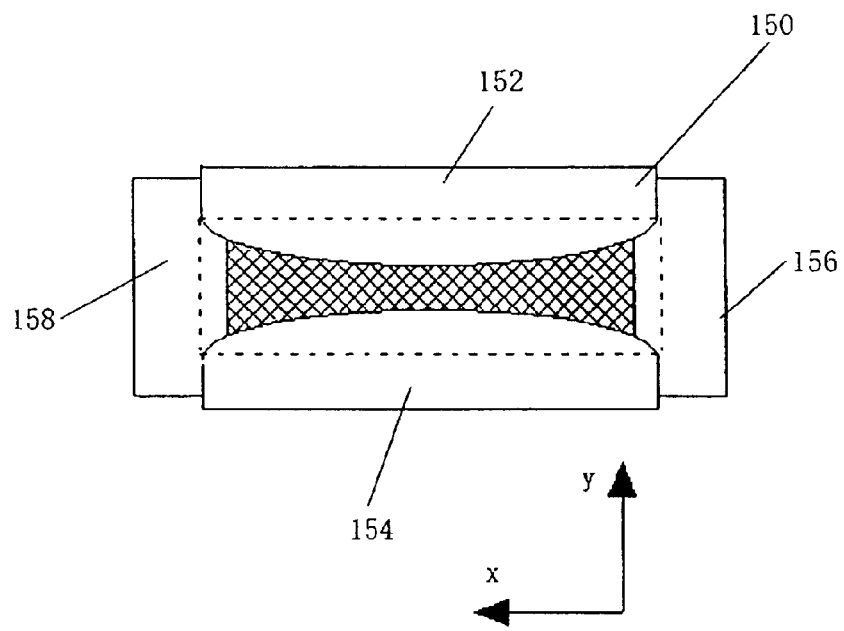
FIG. 18 is a schematic plan view of a masking blade shown in FIG. 11 viewed from a light source.

Referring back to FIG. 11, the masking blade 150 (which will be described later in the instant embodiment) for defining an illuminated area is provided at the target plane, and controls the illuminated area accurately. FIG. 18 is a schematic plan view of the masking blade 150 shown in FIG. 11 viewed from the light source. For the rectangular illuminated area formed by the illumination apparatus 100B indicated by dotted lines, light blocking plates 152–158 shield light at each side of the illuminated area and forms, for example, such an illuminated area as is wide on the periphery and narrowest near the axis as shown (as a gray area in the figure).

Figure 19:
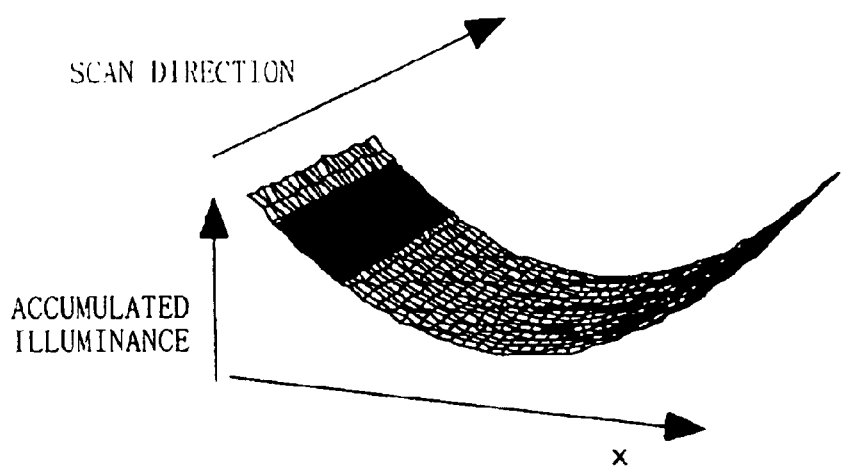
FIG. 19 is a schematic typical view showing one example of simulated accumulated illuminance on an object W as a result of illumination using the masking blade shown in FIG. 18.

If it is assumed that the illumination apparatus 100B uniformly illuminates the rectangular illuminated area (or an area surrounded by dotted lines in FIG. 18), scan exposure is performed for the area formed by the masking blade 150 (i.e., the illuminated area hatched in FIG. 18). As a result, accumulated illuminance on the object W becomes higher on the periphery as shown in FIG. 19. Here, FIG. 19 is a schematic typical view showing one example of simulation as to the accumulated illuminance on the object W using the masking blade 150 shown in FIG. 18 for illumination. It is assumed that the masking blade 150 has an aperture which is widest on the axis and narrower on the periphery. The illuminated area formed by this masking blade 150 would provide an accumulated illumination distribution on the object W, in contrast with the simulation in FIG. 19, with lower illuminance on the periphery.

Figure 20:
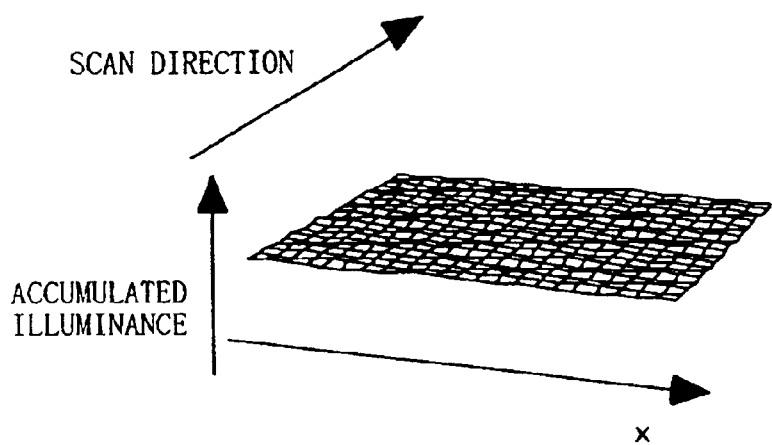
FIG. 20 is a schematic typical view showing another example of simulated accumulated illuminance on the object W as a result of illumination using the masking blade shown in FIG. 18.

It is thus understood that the masking blade 150 may control an accumulated illumination distribution on the object W, i.e., uneven illuminance in a non-accumulated direction (i.e., the direction x) by controlling a shape of the illuminated area. For even lower illuminace on the periphery in the direction x, as previously shown in FIG. 17, the uniform accumulated illuminance is available as shown in FIG. 20 when it is aligned with the direction x of the illuminated area (or the rectangular area indicated by dotted lines in FIG. 18). Here, FIG. 20 is a schematic typical view showing one example of simulation of an accumulated illuminance on the object W using the masking blade 150 shown in FIG. 18 for illumination. Thus, the light blocking plates 152 and 154 of the masking blade 150 shield light on the axis to form a desired illuminated area (the area hatched in FIG. 18).

Nevertheless, as mentioned above, for remarkably lowered illuminance on the periphery shown in FIG. 17, the uniform accumulated illuminance is available for the scan exposure by making a width near the axis narrower than the peripheral width in the illuminated area. This would increase a light blocking part for the illuminated area formed by the illumination apparatus 500 and lower the light utilization efficiency. Even a conventional illumination apparatus 100B has attempted to eliminate a negative influence of distortion using a condenser lens 140, which will be described later, to illuminate the masking blade 150 in a superimposing way, but only the condenser lens 140 cannot satisfactorily meet the recent demands for miniaturization. Accordingly, as a result of earnest review of this problem, the instant inventor has discovered that the optical system for enlarging the angular distribution in the longitudinal direction change a position of its light exit plane in forming a rectangular illuminated area using the optical integrator. In other words, the instant inventor has discovered that the distortion in the peripheral area would be reduced by making the back focus of the optical system for enlarging the angular distribution in the longitudinal direction which provides the high image height, shorter than the back focus of the optical system for enlarging the angular distribution in the lateral direction.

Figure 4:
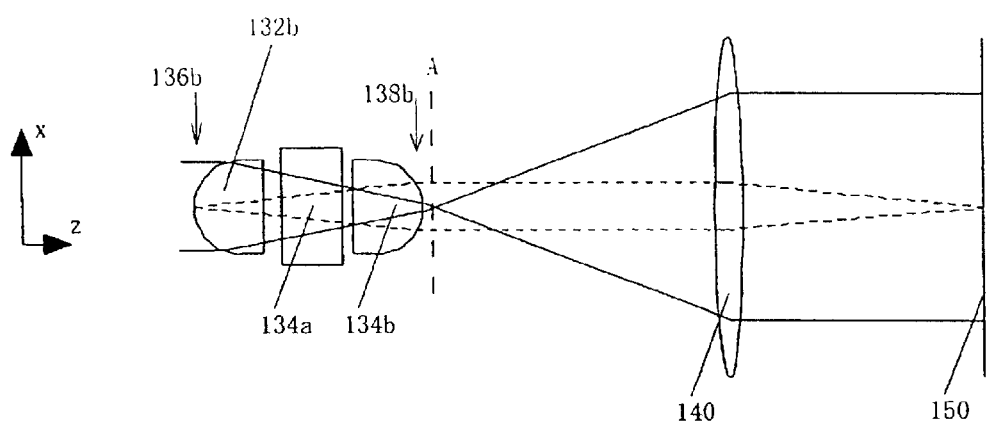
FIG. 4 is a schematic side view showing in detail part of the illumination optical system shown in FIG. 3.
Figure 5:
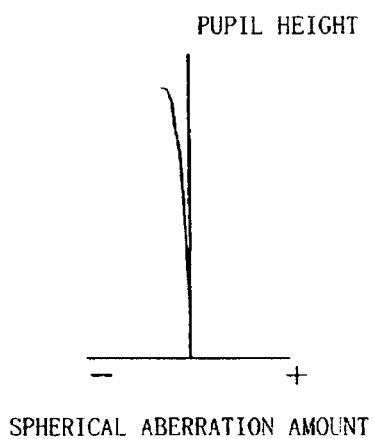
FIG. 5 is a graph showing spherical aberration at a plane A shown in FIG. 4

Referring to FIG. 4, the optical integrator 130 in this embodiment designs a back focus (or condensing point) to be at the plane A0 in the figure, i.e., around the lens array 134b for light formed by the optical system 130b where parallel light enters its light incidence plane 136b since no optical element exists behind. Here, FIG. 4 is a schematic side view showing in detail part of the illumination optical system 100 shown in FIG. 3. As shown in FIG. 5, since the inventive optical system 130b (i.e., the optical system having power in the longitudinal direction) has such a short back focus as causes smaller spherical aberration than that in FIG. 15. Here, FIG. 5 is a graph showing spherical aberration on the plane A shown in FIG. 4.

Figure 6:
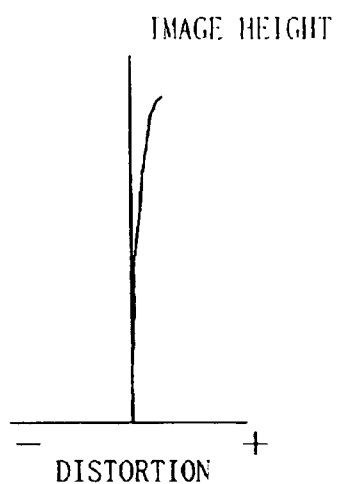
FIG. 6 is a graph that expresses as distortion the spherical aberration shown in FIG. 5.
Figure 7:
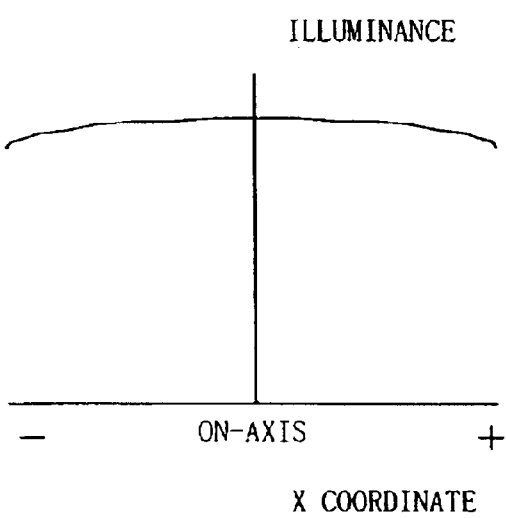
FIG. 7 is a graph showing an illumination distribution of an illuminated plane shown in FIG. 4.

Since the plane of incidence 136b of the cylindrical lens array 132b and the illuminated plane (i.e., the masking blade 150) are approximately conjugate with each other. When the plane of incidence 136b and the illuminated plane are evaluated to be object and image planes, respectively, the previous spherical aberration may be represented as distortion shown in FIG. 6. Here, FIG. 6 is a graph in which the spherical aberration shown in FIG. 5 is represented as distortion. It is understood that this would be also a smaller value than the conventional value in FIG. 16. As shown in FIG. 7, the illumination distribution on the target plane hangs down with distance from the axis, but it is kept sufficiently small compared to FIG. 17 as a conventional example. In other words, the inventive illumination apparatus 100 effectively reduces non-uniform illuminance in the direction x. Here, FIG. 7 is a graph showing the illumination distribution on the illuminated plane shown in FIG. 4.

Figure 8:
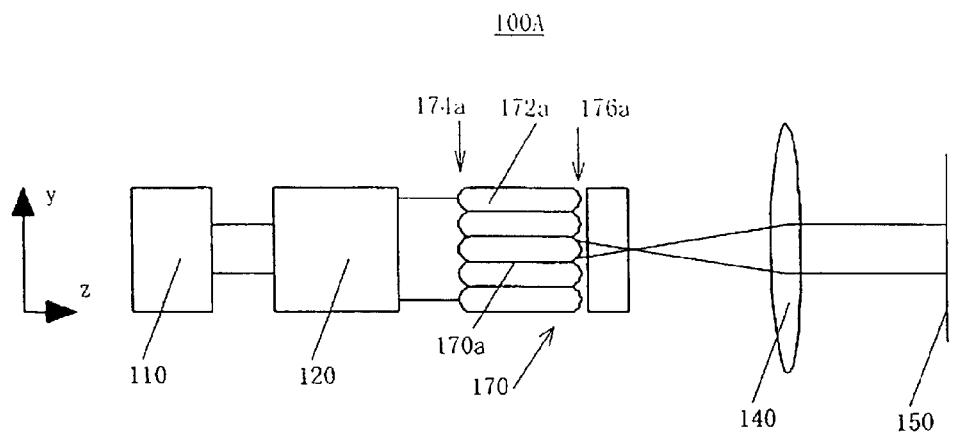
FIG. 8 is a schematic side view corresponding to FIG. 2 showing part of a variation of the illumination apparatus shown in FIG. 1.
Figure 9:
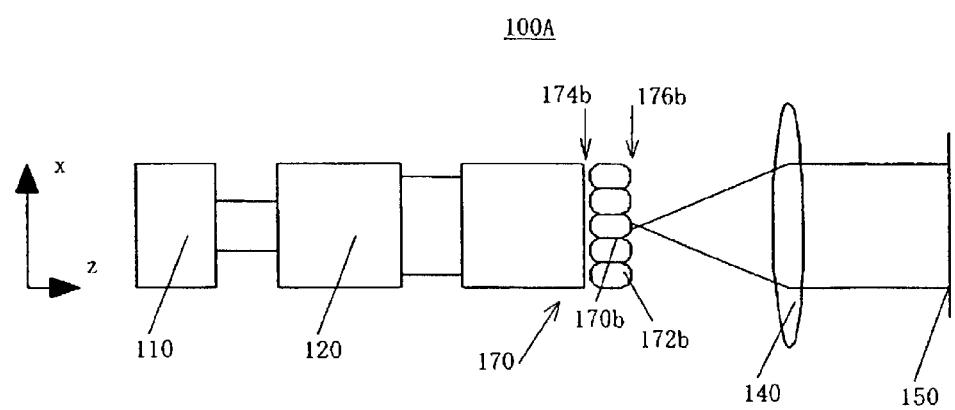
FIG. 9 is a schematic side view corresponding to FIG. 3 showing part of a variation of the illumination apparatus shown in FIG. 1.

An application of the present invention is not limited only to the above optical system 130, but may cover any illumination apparatus that uses an optical integrator having a similar inventive structure. For example, as shown in FIGS. 8 and 9, the optical integrator 130 may be replaced with the optical integrator 170. Here, FIG. 8 is a schematic side view corresponding to FIG. 2 showing part of the illumination apparatus 100A as a variation of the illumination apparatus 100 shown in FIG. 1. FIG. 9 is a view corresponding to FIG. 3 showing part of the illumination apparatus 100A as a variation of the illumination apparatus 100 shown in FIG. 1. In such a variation, the optical integrator 170 includes the optical systems 170a and 170b, and their planes of incidence 174a and 174b are in a relationship conjugate with the illuminated planes, respectively.

As shown in FIGS. 8 and 9, the optical system 170a arranges in a row in the direction y optical elements 172a which extend in the direction x and have a power component primarily in the plane yz. The optical element 172a may include, for example, a convex lens array or a concave mirror array (or cylindrical lens array or cylindrical mirror array), and, a detailed description thereof will be omitted here. The optical element 172a in the optical system 170a has its power to enlarge the angular distribution smaller than that of the optical element 172b, which will be described later.

As shown in FIGS. 8 and 9, the optical system 170b arranges in a row in the direction x optical elements 172b which extend in the direction y and have a power component primarily in the plane xz. The optical element 172b may include, for example, a convex lens array or a concave mirror array (or cylindrical lens array or cylindrical mirror array), and, a detailed description thereof will be omitted here. The optical element 172b in the optical system 170b has its power to enlarge the angular distribution larger than that of the optical element 172a, which will be described above.

Preferably, the optical integrator 170 arranges the light exit plane of the optical system for enlarging the angular distribution of light of incidence in the longitudinal direction of the illuminated area, i.e., a light exit plane 176b of the optical system 170b, closer to the illuminated area than the optical system for enlarging the angular distribution of light of incidence in the lateral direction of the illuminated area, i.e., a plane of exit 176a of the optical system 170a. Light condensing positions at sides of the planes of exit 176a and 176b of the optical systems 170a and 170b with respect to the sections yz and xz are designed to be in a back space to prevent their optical elements from getting damaged by their enormous energy density.

From the above, the optical integrator 170 is preferably arranged in order from the light source of the optical systems 170a and 170b. The optical integrator 170 having such a structure may exhibit similar operations to those of the above optical integrator 130, and improving the illuminance uniformity on the illuminated area. As the optical system 170b follows the optical system 170a, the back focus of the optical system 170a becomes somewhat longer but within a negligible range because the optical system 170b does not have a high image height. In other words, compared to the extended back focus of the optical system 170a when the optical system 170a is provided in the subsequent stage of the optical system 170b, illuminance necessary for illumination is kept sufficient.

Referring back to FIGS. 1–3, the condenser lens 140 condenses as many light sources (images) formed near the optical integrator 130's light exit plane as possible, superimposes them onto the masking blade 150, and Koehler-illuminates the blade 150.

Figure 10:
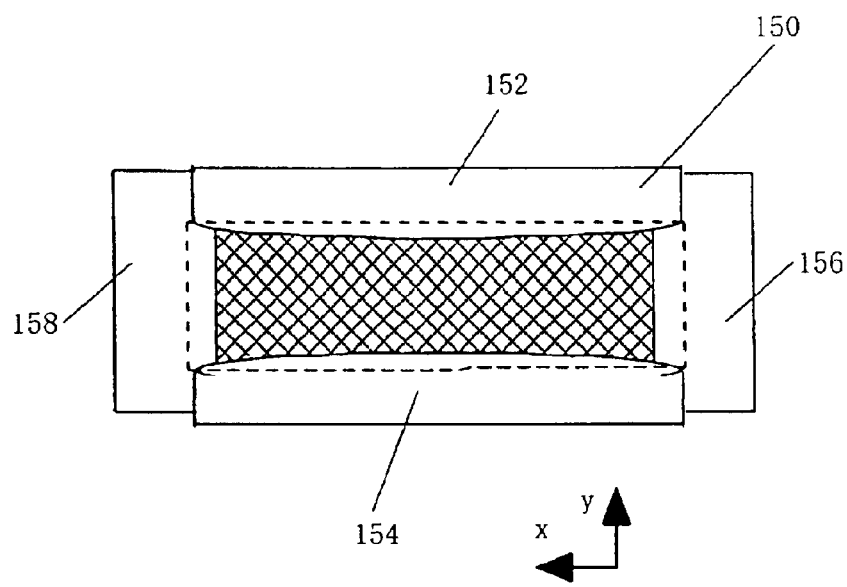
FIG. 10 is a schematic plan view of a masking blade shown in FIG. 1 when viewed from a light source.

The masking blade 150 limits an exposure range on the surface of the mask 200. The blade 150 includes multiple mobile light blocking plates 152–158 and forms an arbitrary aperture shape. The mobile light blocking plates may only be the light blocking plates 152 and 154. Referring to FIG. 10, for the illuminated area formed by the illumination apparatus 100 as indicated by dotted lines, the light blocking plates 152, 154, 156, or 158 block each side of the illuminated area from light, and forming, for example, an illuminated area which is wider on the periphery and narrowest near the axis (i.e., a gray area in the drawing). Here, FIG. 10 is a schematic side view of the masking blade 150 shown in FIG. 1 viewed from the light source. The moving light blocking plates 152 and 154 in the masking blade 150 may shield light and accurately form non-uniform illuminance in the direction x (or a sub-scan direction) in the illumination apparatus 100, as mentioned for the conventional example. The masking blade 150 defines a shape of the illuminated area, and may make the accumulated illuminance uniform. Because of such a masking blade 150, the illuminated area that the illumination apparatus 100 forms has a rectangular or arc shape.

The image-forming lens 160 is, for example, a condenser lens, and transfers the aperture shape of the masking blade 150 onto the mask 200 as a plane to be illuminated.

The mask 200 is, e.g., of quartz, on which a circuit pattern (or an image) to be transferred is created, and is supported and driven by a mask stage (not shown). Diffracted light through the mask 200 is projected through the projection optical system 300 onto the object W. The object W is a target to be exposed, onto which resist is applied. The mask 200 and the object W are located in an optically conjugate relationship. The exposure apparatus 1 in this embodiment is a step-and-scan type exposure apparatus (namely, a scanner), and therefore scans the mask 200 and the object W to transfer the pattern on the mask 200 onto the object W. When it is a step-and-repeat type exposure apparatus (i.e., "a stepper"), the mask 200 and the object W are kept stationary for exposure.

The mask stage supports the mask 200, and is connected to a transport mechanism (not shown). The mask stage and the projection optical system 300 are installed on a stage tube stool supported via a damper, for example, to the base-frame placed on the floor. The mask stage can use any structure known in the art. The transport mechanism (not shown) is made up of a linear motor and the like, and drives the mask stage in XY directions, thus moving the mask 200. The exposure apparatus 1 scans the mask 200 and the object W in a state synchronized by a control unit (not shown).

The projection optical system 300 forms an image onto the object W from diffracted light that has passed through the pattern formed on the mask 200. The projection optical system 300 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The object W is a wafer in this embodiment, but it may include a liquid crystal plate and a wide range of other objects to be exposed. Photoresist is applied onto the object W. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The object W is supported by a wafer stage (not shown). The wafer stage may use any structure known in the art, and thus a detailed description of its structure and operations will be omitted. For example, the wafer stage uses a linear motor to move the object W in xy directions. The mask 200 and object W are, for example, scanned synchronously, and the positions of the mask stage and wafer stage are monitored, for example, by a laser interferometer and the like, so that both are driven at a constant speed ratio. The wafer stage is installed on a stage surface plate supported on the floor and the like, for example, via a damper, and the mask stage and the projection optical system 300 are installed on a body tube surface plate (not shown) supported, for example, via a damper to the base-frame placed on the floor.

The wafer stage may include an image-forming position adjuster. The image-forming position adjuster is connected to the wafer stage, and moves the object W together with the wafer stage in a direction Z (shown in FIG. 1) within the depth of focus, thus adjusting the image-forming position of the object W. The exposure apparatus 1 performs a number of exposure operations for the object W disposed in different positions to the direction Z, thereby eliminating dispersions in the image-forming performance within the depth of focus. The image-forming position adjuster may use any techniques known in the art such as a rack (not shown) extending in the direction Z, a pinion (not shown) connected to the stage 450 and mobile on the rack, a means for rotating the pinion and the like, and thus a detailed description thereof will be omitted.

In exposure operation, a light beam emitted from the laser 110 is reshaped into a desired beam shape by the beam shaping system 120, and then enters the optical system 130. The beam having entered the optical integrator 130 forms the illuminated plane into a rectangle, i.e., an illuminated area having a longer section xz is formed, since the optical systems 130a and 130b have different power components. At this time, the beam exiting from the optical integrator 130 is split into many partial beams, which will make a secondary light source.

The optical integrator 130 illuminates the masking blade 150 uniformly via the condenser lens 140. The beam having passed the masking blade 150 passes the image-forming lens 160, and then illuminates the illuminated plane of the mask 200.

The beams, which have passed through the mask 200 are demagnified and projected under a specific magnification onto the object W through the image-forming operation of the projection optical system 300. The exposure apparatus 1 of a step-and-scan type would fix the light source part and the projection optical system 300, and synchronously scan the mask 200 and object W, then exposing the entire shot. The wafer stage for the object W is stepped to the next shot, thus exposing and transferring a large number of shots onto the object W. If the exposure apparatus 1 is of a step-and-repeat type, exposure would be performed with the mask 200 and the object W in a stationary state.

Compared to the conventional example shown in FIG. 11, the inventive exposure apparatus 1 has a little non-uniform illuminance (or a reduced amount in illuminance) in the direction x, thus decreasing the part light blocked by the light blocking plates 152–158 of the masking blade 150, and enhancing light utilization efficiency. As a result, the exposure apparatus 1 will have an improved throughput. Accordingly, the exposure apparatus 1 will perform a pattern transfer to the resist with high precision, thus providing high quality devices (such as semiconductor devices, LCD devices, image pick-up devices (such as CCDs), thin film magnetic heads, and the like).

Figure 21:
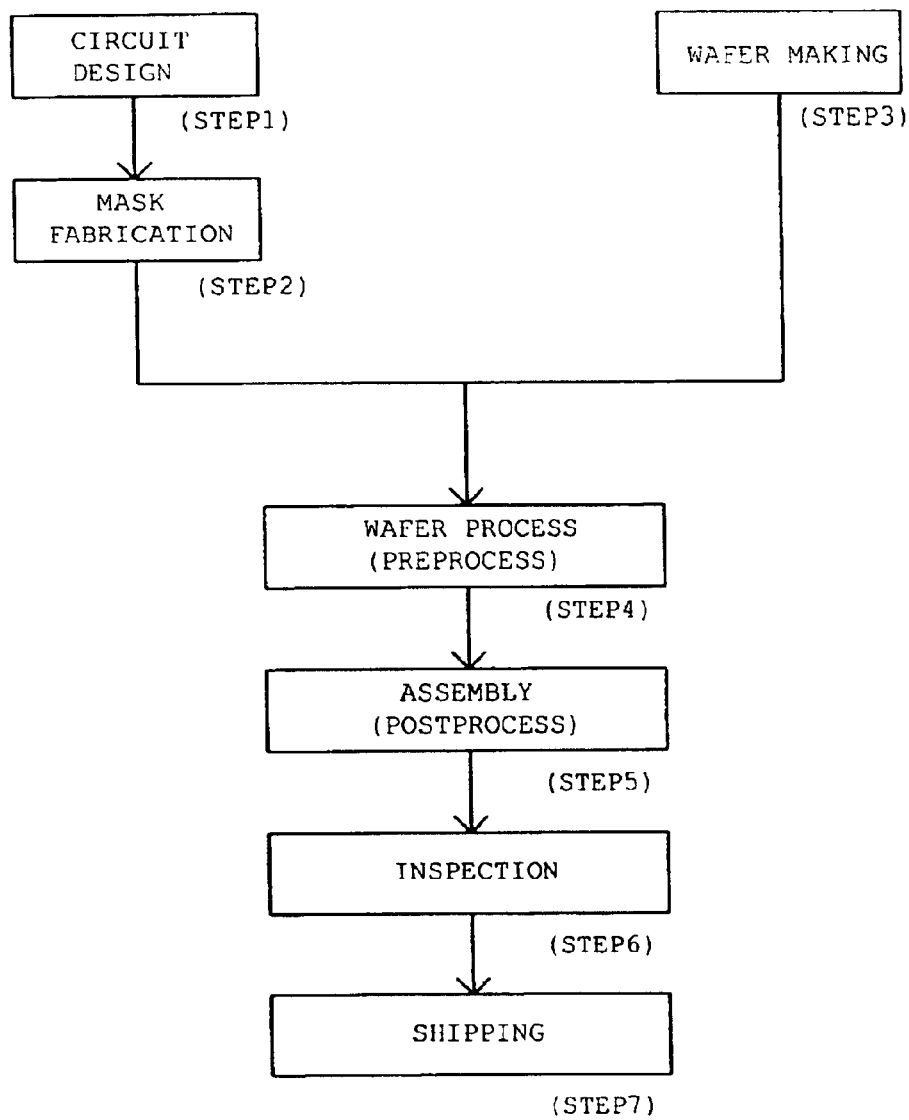
FIG. 21 is a flowchart for explaining a fabrication of devices (semiconductor chips such as ICs, LSIs, and the like, LCDs, CCDs, etc.).
Figure 22:
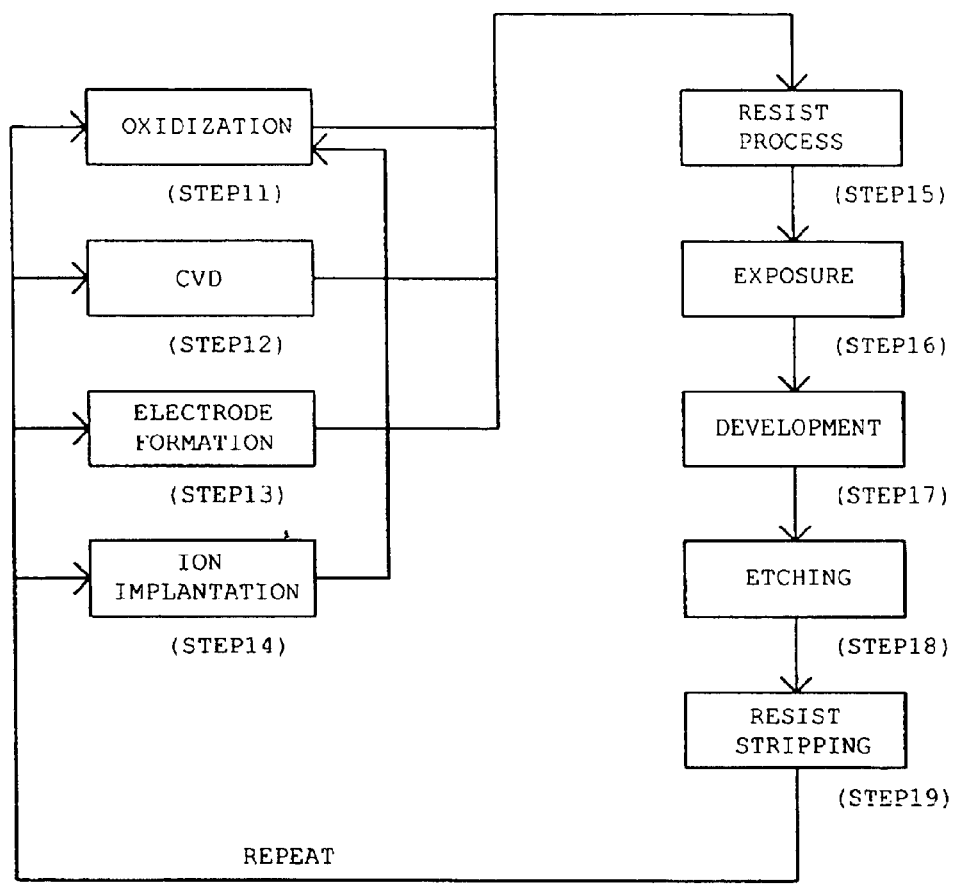
FIG. 22 is a detailed flowchart for Step 4 Wafer shown in FIG. 21.

Referring to FIGS. 21 and 22, a description will now be given of an embodiment of a device fabricating method using the above mentioned exposure apparatus 1. FIG. 21 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 22 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer.

Further, the present invention is not limited to these preferred embodiments, and various modifications and changes may be made in the present invention without departing from the spirit and scope thereof.

According to the inventive exposure apparatus and illumination apparatus as its part, the plane of exit of the optical system for enlarging a beam in a longitudinal direction is located closest to the side of an illuminated plane to shorten the back focus of the optical system. Thereby, it is possible to avoid the lowered illuminance on the periphery in a longitudinal direction in a rectangular illuminated area. In other words, the arrangement of the optical system with stronger power close to the target plane would provide more uniform illumination to the target area in its longitudinal direction. Therefore, use of such an illumination apparatus for an exposure apparatus would realize projection and exposure with high light utilization efficiency and a high throughput. Such an exposure apparatus will perform a pattern transfer to the resist with high precision, thus providing high quality devices (such as semiconductor devices, LCD devices, image pick-up devices (such as CCDs), thin-film magnetic heads, and the like).

What is claimed is:

1. An illumination apparatus for illuminating a target plane by using light emitted from a light source, said illumination apparatus comprising:
   an optical integrator that includes a first optical system and a second optical system,
   wherein a power component of the first optical system in a longitudinal direction of an illuminated area on the target plane is greater than a power component of the first optical system in a lateral direction of the illuminated area,
   wherein a power component of the second optical system in the lateral direction is greater than a power component of the second optical system in the longitudinal direction, and
   wherein a light exit plane of the first optical system is provided closer to the target plane than a light exit plane of the second optical system.

2. An illumination apparatus according to claim 1, wherein the first optical system includes a pair of cylindrical lens arrays, whereas the second optical system includes a pair of cylindrical lens arrays, and
   wherein a light beam incident upon said optical integrator enters in order from a third lens set, a first lens set, a fourth lens set, and a second lens set where the first and second lens sets are the pair of cylindrical lens arrays in the first optical system in order from light incidence plane, and the third and fourth lens sets are the pair of cylindrical lens arrays in the second optical system are in order from the light incidence plane.

3. An illumination apparatus according to claim 2, wherein a light incidence plane of the third lens set and a light incidence plane of the first lens set are located to be approximately conjugate with the target plane.

4. An illumination apparatus according to claim 1, wherein the first optical system includes in the longitudinal direction an optical element that extends in the lateral direction, whereas the second optical system includes in the lateral direction an optical element that extends in the longitudinal direction, and
   wherein the light exit plane of the first optical system is located closer to the target plane than the light exit plane of the second optical system.

5. An illumination apparatus according to claim 4, wherein said optical element is a convex lens array or a concave mirror array.

6. An illumination apparatus according to claim 4, wherein the light incidence plane of the first optical system and a light incidence plane of the second optical system are located to be approximately conjugate with the target plane.

7. An illumination apparatus according to claim 1, wherein the illuminated area has a rectangular or arc shape.

8. An illumination apparatus according to claim 1, wherein a plane of incidence of the first optical system and the light incidence plane of the second optical system are located to be approximately conjugate with the target plane.

9. An exposure apparatus comprising:
   an illumination apparatus for illuminating a reticle or masks by using light emitted from a light source; and
   an optical system that projects a pattern of the reticle or mask onto an object to be exposed,
   wherein said illumination apparatus includes:
      an optical integrator that includes a first optical system and a second optical system,
      wherein a power component of the first optical system in a longitudinal direction of an illuminated area on the reticle or mask is greater than a power component of the first optical system in a lateral direction of the illuminated area, wherein a power component of the second optical system in the lateral direction is greater than a power component of the second optical system in the longitudinal direction, and wherein a light exit plane of the first optical system is provided closer to the target plane than a light exit plane of the second optical system.

10. A device fabricating method comprising the steps of:

exposing onto an object by using an exposure apparatus comprising an illumination apparatus for illuminating a reticle or mask by using light emitted from a light source and an optical system that projects a pattern of the reticle or mask onto an object to be exposed, wherein said illumination apparatus includes an optical integrator that includes a first optical system and a second optical system, wherein a power component of the first optical system in a longitudinal direction of an illuminated area on the reticle or mask is greater than a power component of the first optical system in a lateral direction of the illuminated area, wherein a power component of the second optical system in the lateral direction is greater than a power component of the second optical system in the longitudinal direction, and wherein a light exit plane of the first optical system is provided closer to the target plane than a light exit plane of the second optical system; and performing a specified process on the exposed object.

11. An illumination apparatus for illuminating a target plane by using light emitted from a light source comprising:

an optical integrator including a first optical system which has a pair of cylindrical lens arrays whose generating line is parallel to a lateral direction of an illuminated area on the target plane, and a second optical system which has a pair of cylindrical lens arrays whose generating line is parallel to a longitudinal direction of the illuminated area, wherein a light beam incident upon said optical integrator enters in order from a third lens set, a first lens set, a fourth lens set, and a second lens set where the first and second lens sets are the pair of cylindrical lens arrays in the first optical system in order from light incidence plane, and the third and fourth lens sets are the pair of cylindrical lens arrays in the second optical system in order from the light incidence plane.

12. An exposure apparatus comprising:

(1) an illumination apparatus for illuminating a reticle or mask by using light emitted from a light source comprising, an optical integrator that includes a first optical system which has a pair of cylindrical lens arrays whose generating line is parallel to a lateral direction of an illuminated area on the reticle or mask, and a second optical system which has a pair of cylindrical lens arrays whose generating line is parallel to a longitudinal direction of the illuminated area, wherein a light beam incident upon said optical integrator enters in order from a third lens set, a first lens set, a fourth lens set, and a second lens set where the first and second lens sets are the pair of cylindrical lens arrays in the first optical system in order from light incidence plane, and the third and fourth lens sets are the pair of cylindrical lens arrays in the second optical system are in order from the light incidence plane; and (2) an optical system that projects a patter of the reticle or mask onto an object to be exposed.

13. A device fabricating method comprising the step of:

exposing onto an object by using an exposure apparatus comprising (1) an illumination apparatus for illuminating a reticle or mask by using light emitted from a light source including, an optical integrator that includes a first optical system which has a pair of cylindrical lens arrays whose generating line is parallel to a lateral direction of an illuminated area on the reticle or mask, and a second optical system which has a pair of cylindrical lens arrays whose generating line is parallel to a longitudinal direction of the illuminated area, wherein a light beam incident upon said optical integrator enters in order from a third lens set, a first lens set, a fourth lens set, and a second lens set where the first and second lens sets are the pair of cylindrical lens arrays in the first optical system in order from light incidence plane, and the third and fourth lens sets are the pair of cylindrical lens arrays in the second optical system are in order from the light incidence plane, and (2) an optical system that projects a pattern of the reticle or mask onto an object to be exposed; and developing the exposed object.

* * * * *